US012339693B2

(12) United States Patent
Wiersch et al.

(10) Patent No.: US 12,339,693 B2
(45) Date of Patent: Jun. 24, 2025

(54) CIRCUIT AND SYSTEM FOR ACTIVELY DISCHARGING A POWER STAGE INPUT NODE DURING POWER SUPPLY TURN-ON

(71) Applicant: TEXAS INSTRUMENTS INCORPORATED, Dallas, TX (US)

(72) Inventors: Manuel Wiersch, Freising (DE); Ferdinand Stettner, Dachau (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 322 days.

(21) Appl. No.: 18/171,006

(22) Filed: Feb. 17, 2023

(65) Prior Publication Data
US 2024/0210982 A1   Jun. 27, 2024

Related U.S. Application Data

(60) Provisional application No. 63/476,501, filed on Dec. 21, 2022.

(51) Int. Cl.
G05F 3/26 (2006.01)
H03K 17/22 (2006.01)

(52) U.S. Cl.
CPC ........... G05F 3/262 (2013.01); H03K 17/223 (2013.01)

(58) Field of Classification Search
CPC ..... G05F 1/10; G05F 1/56; G05F 1/46; G05F 1/461; G05F 1/468; G05F 1/562; G05F 1/565; G05F 1/569; G05F 1/575; G05F 1/573; G05F 1/59; G05F 1/595; G05F 3/08; G05F 3/20; G05F 3/24; G05F 3/26; G05F 3/262; H02M 1/0003; H02M 1/0029; H02M 1/0045; H02M 1/0054; H02M 1/32; H02M 1/36; H02M 3/07; H02M 3/156; H03K 17/16; H03K 17/161; H03K 17/162; H03K 17/163; H03K 17/22; H03K 17/223
See application file for complete search history.

(56) References Cited

U.S. PATENT DOCUMENTS 6,191,644 B1 * 2/2001 Srinath .................... G05F 3/30
                                                      327/539
6,747,500 B2   6/2004 Mawet
9,712,154 B1   7/2017 Kim
(Continued)

FOREIGN PATENT DOCUMENTS

CN   204425299 U * 6/2015
CN   111446949 B   3/2024

OTHER PUBLICATIONS

International Search Report mailed Apr. 15, 2024.

*Primary Examiner* — Thienvu V Tran
*Assistant Examiner* — Shahzeb K Ahmad
(74) *Attorney, Agent, or Firm* — Valerie M. Davis; Frank D. Cimino

(57) ABSTRACT

A circuit for controlling a discharge transistor for a power stage includes a current mirror, a first diode, and a second diode. The current mirror includes first, second, third and fourth field-effect transistors (FETs) configured to provide a fast startup signal and a startup discharge signal. The startup discharge signal is provided to a gate of the discharge transistor. The first diode is configured to limit the fast startup signal to a first maximum voltage less than the supply voltage, and the second diode is configured to limit the startup discharge signal to a second maximum voltage less than the supply voltage.

20 Claims, 6 Drawing Sheets

(56) References Cited

U.S. PATENT DOCUMENTS

| | | | |
|---|---|---|---|
| 11,237,585 B2 | 2/2022 | Carlos | |
| 2007/0170978 A1* | 7/2007 | Furuichi | H03K 17/0822 |
| | | | 327/530 |
| 2013/0038309 A1* | 2/2013 | Al-Shyoukh | H03F 3/2173 |
| | | | 323/284 |
| 2016/0191041 A1 | 6/2016 | Chung | |
| 2017/0237421 A1* | 8/2017 | Cui | H03K 17/04106 |
| | | | 327/377 |
| 2019/0173463 A1* | 6/2019 | Mori | H10D 84/83 |
| 2021/0156329 A1* | 5/2021 | Hassan | F02D 41/2467 |

* cited by examiner

CIRCUIT AND SYSTEM FOR ACTIVELY DISCHARGING A POWER STAGE INPUT NODE DURING POWER SUPPLY TURN-ON

RELATED APPLICATIONS

This application hereby claims the benefit of and priority to U.S. Provisional Patent Application No. 63/476,501, titled "CIRCUIT AND SYSTEM FOR ACTIVELY DISCHARGING A POWER STAGE INPUT NODE DURING POWER SUPPLY TURN-ON", filed on Dec. 21, 2022 and which is hereby incorporated by reference in its entirety.

TECHNICAL BACKGROUND

Power stage input nodes often include a pair of power field-effect transistors (FETs), a high-side FET and a low-side FET. During initial power up of the power stage an input voltage VIN is applied to the device and often there is some voltage on the gate of the high-side power FET due to the drain-gate capacitance within the high-side FET. In modern high-current converters the gate driver is not directly provided with VIN, but connected to VIN through a resistor-capacitor (RC) filter and a supply disconnect switch, or connected to a power rail that is either regulated or clamped to ensure that the internal voltage does not exceed a given maximum voltage. For example, some embodiments provide for a VIN up to 6.5V and clamp the internal power rail to 4.8V.

Depending on the internal supply voltage regulator or clamping circuit there can be a significant amount of time before the internal voltage is high enough to discharge the high-side FET gate after applying the input voltage. This results in a partial turn-on of the high-side FET, producing current in an inductor within the power stage and a pre-charge of the output voltage. Depending on the size of the power transistors and the delay until the internal rail rises, the inductor current can achieve several amperes and also increase the output voltage above its desired value.

SUMMARY

In an implementation, a circuit includes a current mirror, a first diode, and a second diode. The current mirror includes a first FET having a first drain, a first gate, and a first source. The first source is coupled with a supply voltage, and the first gate is coupled to the first drain and to a ground through a resistance element.

The current mirror also includes a second FET having a second source coupled with the supply voltage, a second gate coupled with the first gate and the first drain, and a second drain configured to provide a fast startup signal.

The current mirror further includes a third FET having a third source coupled with the supply voltage, a third gate coupled with the first gate and the first drain, and a third drain, and a fourth FET having a fourth drain coupled with the third drain, a fourth gate coupled with the fast startup signal, and a fourth source configured to provide a startup discharge signal to a gate of a discharge transistor.

The first diode is connected in series between the second drain and the ground, and the first diode is configured to limit the fast startup signal to a first maximum voltage less than a maximum specified supply voltage. The second diode is connected in series between the fourth source and the ground, and the second diode is configured to limit the startup discharge signal to a second maximum voltage less than the maximum specified supply voltage.

In another implementation, a circuit includes first, second, third and fourth FETs. The first FET has a first drain, a first gate, and a first source. The first source is coupled with a supply voltage, and the first gate is coupled to the first drain and to a ground through a resistance element.

The second FET has a second source coupled with the supply voltage, a second gate coupled with the first gate and the first drain, and a second drain coupled to the ground through a first diode, and the second drain provides a fast startup signal.

The third FET has a third source coupled with the supply voltage, a third gate coupled with the first gate and first drain, and a third drain.

The fourth FET has a fourth drain coupled with the third drain, a fourth gate coupled with the fast startup signal, and a fourth source coupled to the ground through a second diode, and the fourth source provides a startup discharge signal to a gate of a discharge transistor.

In a further embodiment, a circuit includes a power switch, a gate driver, a power supply, and a startup module.

The power switch includes a high-side power FET having a drain coupled with a supply voltage. The gate driver is configured to provide a high-side gate signal to a gate of the high-side power FET.

The gate driver includes, a discharge transistor having a drain coupled with the gate of the high-side power FET, a source coupled with a ground, and a gate coupled with a startup discharge signal, and in response to the startup discharge signal, the discharge transistor is configured to discharge the gate of the high-side power FET. The power supply is configured to provide a slow control voltage, and during turn-on the slow control voltage rises slower than the supply voltage.

The startup module is coupled with the power supply and the gate driver, and includes first, second, third, fourth, and fifth FETs. The first FET has a first drain, a first gate, and a first source. The first source is coupled with the supply voltage, and the first gate is coupled to the first drain and to a ground through a resistance element.

The second FET has a second source coupled with the supply voltage, a second gate coupled with the first gate and the first drain, and a second drain coupled to the ground through a first diode, and the second drain provides a fast startup signal.

The third FET has a third source coupled with the supply voltage, a third gate coupled with the first gate and first drain, and a third drain.

The fourth FET has a fourth drain coupled with the third drain, a fourth gate coupled with the fast startup signal, and a fourth source coupled to the ground through a second diode, and the fourth source provides the startup discharge signal to the gate of the discharge transistor.

The fifth FET is configured in series between the ground and the resistance element and has a fifth gate coupled to the slow control voltage.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

The following descriptions of various example embodiments and implementations of a circuit and system for actively discharging a power stage input node during power supply turn-on. In these various examples, embodiments of the disclosure provide for a startup module that provides a startup discharge signal to the gate of a discharge transistor within a gate driver for a power stage input node. The startup module is configured to generate the startup discharge signal quickly such that it closely tracks the rise of the overall supply voltage VIN. This allows the discharge transistor within the gate driver to turn on quickly during the power up process and dissipate any charge from the drain-gate capacitor within the high-side power FET. This discharges the parasitic capacitor within the high-side power FET before the FET turns on and affects the output of the power stage by introducing charge into the capacitive load of the power stage raising the output voltage on the output of the power stage.

In some embodiments, the circuit includes a power supply or charge pump that is configured to supply a voltage rail below the overall supply voltage (VIN). This slow control voltage is provided to the gate of a FET within the startup module and turns off current mirrors within the startup module that provide the startup discharge signal once the slow control voltage raises above the threshold voltage of the FET. This turns off the startup module once all supply rails within the module have stabilized at their nominal values and the discharge transistor is turned off for normal operation of the power supply.

Figure 1:
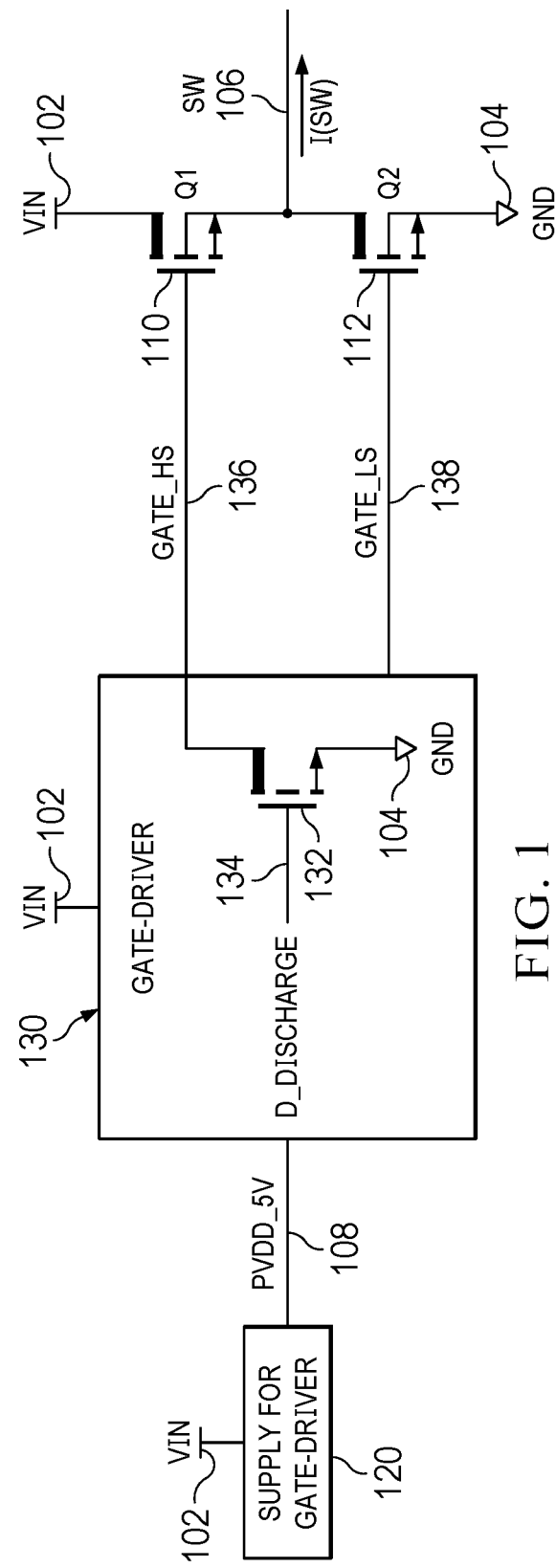
FIG. 1 illustrates a power stage input node along with a gate driver and power supply for the gate driver.

FIG. 1 illustrates a power stage input node along with a gate driver 130 and power supply 120 for the gate driver. As discussed above, power stage input nodes often include a pair of power FETs, a high-side FET (Q1) 110 and a low-side FET (Q2) 112. During initial power up of the power stage an input voltage VIN 102 is applied to the device and often there is some voltage on the gate 136 of the high-side FET 110 due to charge being injected from the drain of the high-side FET 110 into the gate-source capacitance within the high-side FET 110. In modern high-current converters the gate driver 130 is not directly provided with VIN 102, but connected to VIN 102 through a resistor-capacitor (RC) filter and a supply disconnect switch, or connected to a power rail (PVDD_5V 108 in this example) that is either regulated or clamped to ensure that the internal voltage does not exceed a given maximum voltage. For example, some embodiments provide for a VIN 102 up to 6.5V and clamp the internal power rail 108 to 4.8V.

In this example embodiment, gate driver 130 is supplied with internal power rail PVDD_5V 108 and includes a discharge transistor 132 coupled to the gate of the high-side FET (GATE_HS 136 in this example). When the D_DISCHARGE signal 134 is high, the discharge transistor 132 is active and clamps GATE_HS 136 to ground 104, discharging the parasitic capacitor between the gate and source of the high-side power FET 110. Gate driver 130 also provides a GATE_LS 138 signal to the low-side power FET 112. Together high-side power FET 110 and low-side power FET 112 make up a power stage for a power converter and provide signal SW 106 as an output. The current of output signal SW 106 is also shown as I(SW) and will be illustrated in FIG. 2.

Depending on the internal supply voltage regulator 120 or clamping circuit there can be a significant amount of time before the internal voltage (PVDD_5V 108) is high enough to discharge the high-side FET gate 136 after applying the input voltage VIN 102. This results in a partial turn-on of the high-side FET 110, producing current (I(SW)) in an inductor within the power stage and a pre-charge of the output voltage. Depending on the size of the power transistors and the delay until the internal rail rises, the inductor current can achieve several amperes and increase the output voltage above its desired value. These effects are illustrated in FIG. 2 and discussed below.

Figure 2:
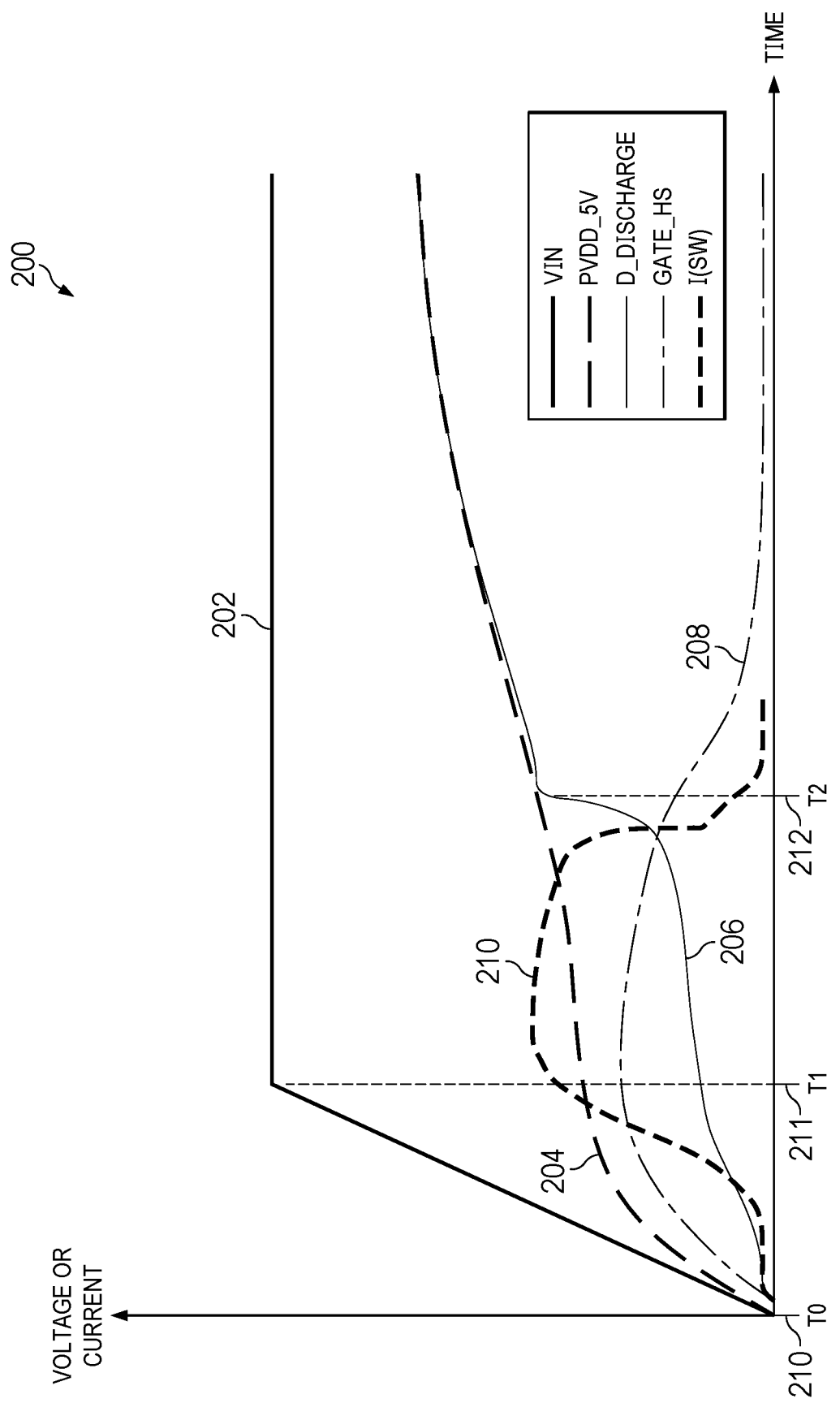
FIG. 2 illustrates example waveforms of the circuit of FIG. 1 during the power up process.

FIG. 2 illustrates example waveforms of the circuit of FIG. 1 during the power up process. In this example embodiment, various waveforms are illustrated on a graph where the vertical axis is increasing voltage or current, and the horizontal axis is time. Starting at time T0 210, all voltages and currents are zero.

During power up, the input supply voltage VIN 202 rises to its nominal value at time T1 211. During this time, PVDD_5V 204 is also rising to its nominal value, but at a rate much slower than the input supply voltage VIN 202. Because the D_DISCHARGE signal 206 is provided by circuitry dependent on PVDD_5V 204 it does not become activated until time T2 212. This delay in activating the discharge transistor 132 allows charge to build up within the parasitic drain-gate capacitor within the high-side power FET 110. This capacitance causes the voltage on the gate of the high-side power FET (GATE_HS 208) to rise during power up and at least partially turn on the high-side power FET 110.

As the high-side power FET 110 turns on, current (I(SW)) 210 starts to flow to the output of the power converter charging up any capacitive load on the output of the power converter and raising the voltage of the output of the power converter. The amount of charge supplied to the load is proportional to the area under the curve of I(SW) 210.

Without a discharge switch 132 on the gate 136 of the high-side FET 110, there will be a voltage on the gate 136 from the drain-source capacitance of the high-side FET 110 after applying an input voltage. Depending on the gate driver 130 power supply 120, there can be a significant delay until PVDD_5V 204 rises. If several logic gates are involved in the generation of the signal D_DISCHARGE 206, the voltage level of D_DISCHARGE 206 at the beginning of the power up sequence can be even lower than PVDD_5V 204, and even further delayed. These effects result in a turn on of the high-side FET 110 for some period of time and the inductor current I(SW) 210 connected to SW 106 can build up several amperes and increase the output voltage of the power converter above an allowed value.

Figure 3:
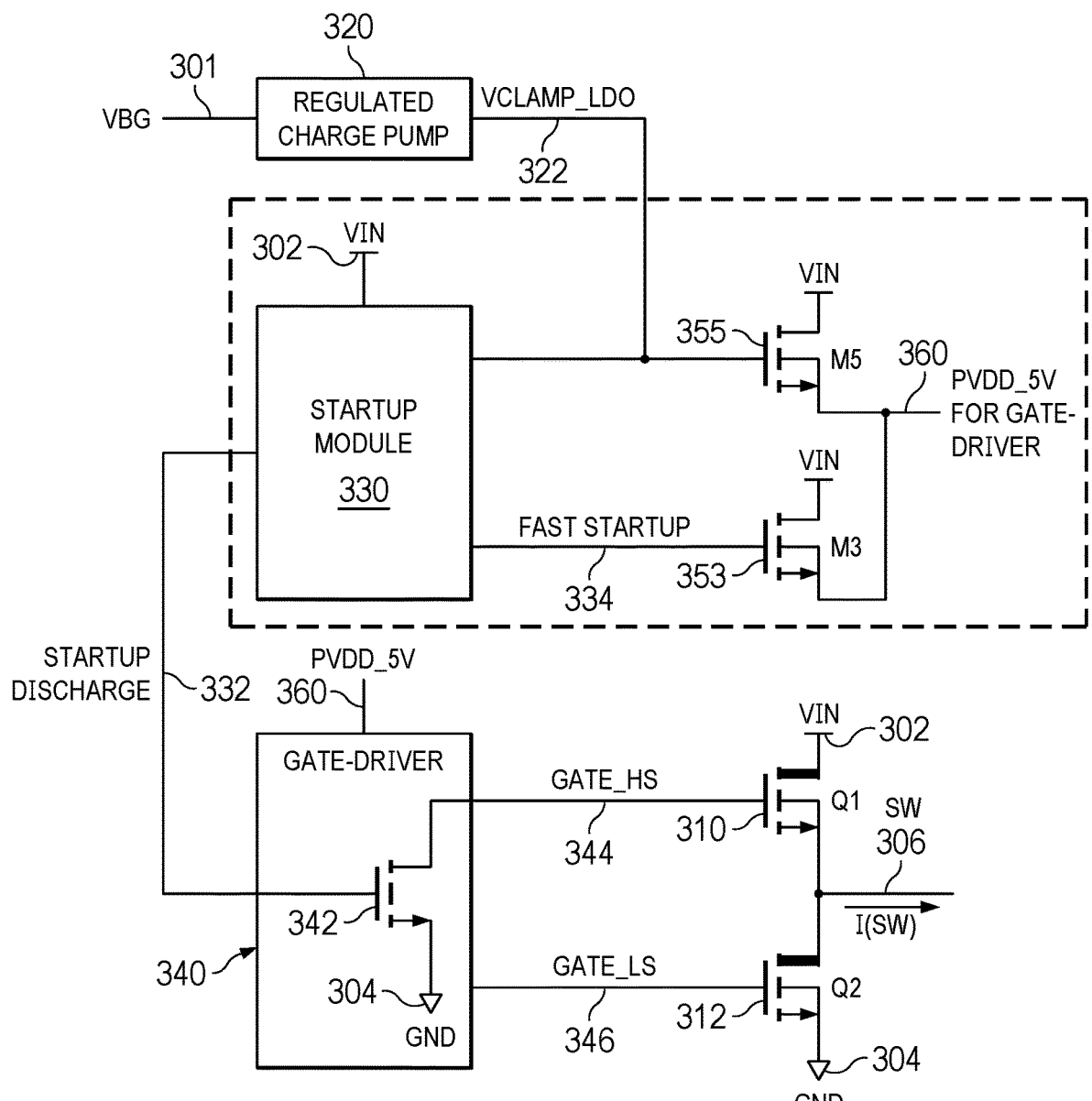
FIG. 3 illustrates an example embodiment of a power stage input node, along with a gate driver, startup module, and power supply.

FIG. 3 illustrates an example embodiment of a power stage input, along with a gate driver 340, startup module 330, and power supply 320. In this example, high-side power FET 310 and low-side power FET 312 are coupled in series and make up the power stage input. The drain of high-side power FET 310 is supplied with the supply voltage VIN 302 and the source of low-side power FET 312 is coupled to ground 304. Their output SW 306 has a current labeled I(SW). The gate of the high-side FET 310 is driven by signal GATE_HS 344 and the gate of the low-side FET 312 is driven by signal GATE_LS 346. These gate signals are provided by gate driver 340 which is powered by supply voltage PVDD_5V 360. Gate driver 340 also includes a discharge transistor 342 coupled to the gate of the high-side FET 310 and configured to discharge the gate of high-side FET 310 when activated by the startup discharge signal 332.

The startup discharge signal 332 is provided by startup module 330. Startup module 330 receives the supply voltage VIN 302 and a slow control voltage VCLAMP_LDO 322 generated by charge pump 320. Startup module 330 is configured to supply a fast startup signal 334 and the startup discharge signal 332. In this example, the charge pump 320 uses the bandgap voltage VBG 301 as a reference for the output voltage of the charge pump 320, however other embodiments may use different configurations. Charge pump 320 produces slow control voltage VCLAMP_LDO 322 which is configured to slowly rise to its nominal value some amount of time after the supply voltage VIN 302 reaches its nominal value.

FETs 353 and 355 have drains coupled to the supply voltage VIN 302 and gates coupled to the fast startup signal 334 and the slow control voltage VCLAMP_LDO 322 respectively. Their sources are coupled together to provide PVDD_5V 360 to gate driver 340.

The startup module 330 is configured to generate the startup discharge signal 332 quickly such that it closely tracks the rise of the overall supply voltage VIN 302. This provides an advantage of discharging the parasitic capacitor within the high-side power FET Q1 310 before the FET turns on and affects the output of the power stage. In some embodiments, the startup discharge signal is also provided to at least one logic gate configured to avoid turning on the discharge transistor during an electrostatic discharge (ESD) event.

The slow control voltage VCLAMP_LDO 322 is a regulated voltage on the gate of an NMOS source follower (NMOS pass device) to clamp the internal voltage rail to a specified value. It is configured to provide a slow control voltage to regulate the internal supply and during turn-on, the control voltage rises slower than the supply voltage. The slow control voltage VCLAMP_LDO 322 is provided to the gate of a FET within the startup module 330 and turns off current mirrors within the startup module 330 that provide the startup discharge signal 332 once the slow control voltage VCLAMP_LDO 322 rises above the threshold voltage of the FET. This provides an advantage of turning off the startup module 330 once all supply rails within the module 330 have stabilized at their nominal values and the discharge transistor 342 is turned off for normal operation of the power supply.

In this example embodiment, after the supply voltage VIN 302 is applied, a pre-charge circuit brings up the slow control voltage VCLAMP_LDO 322. Once band gap voltage is available, charge pump 320 increases the slow control voltage VCLAMP_LDO 322. Another fast supply rail is required to have sufficient voltage as fast as possible for the gate driver 340 to avoid the high-side FET 310 from turning on, resulting in high current I(SW) into SW 306. The startup discharge signal 332 is a very fast supply rail signal that is only used for some time after VIN 302 is applied to keep the gate of the high-side FET 310 tied to ground 304. After some time, the startup discharge signal 332 is actively pulled down to shut off the discharge transistor 342. An example embodiment of startup module 330 is illustrated in FIG. 4 and described in detail below.

Figure 4:
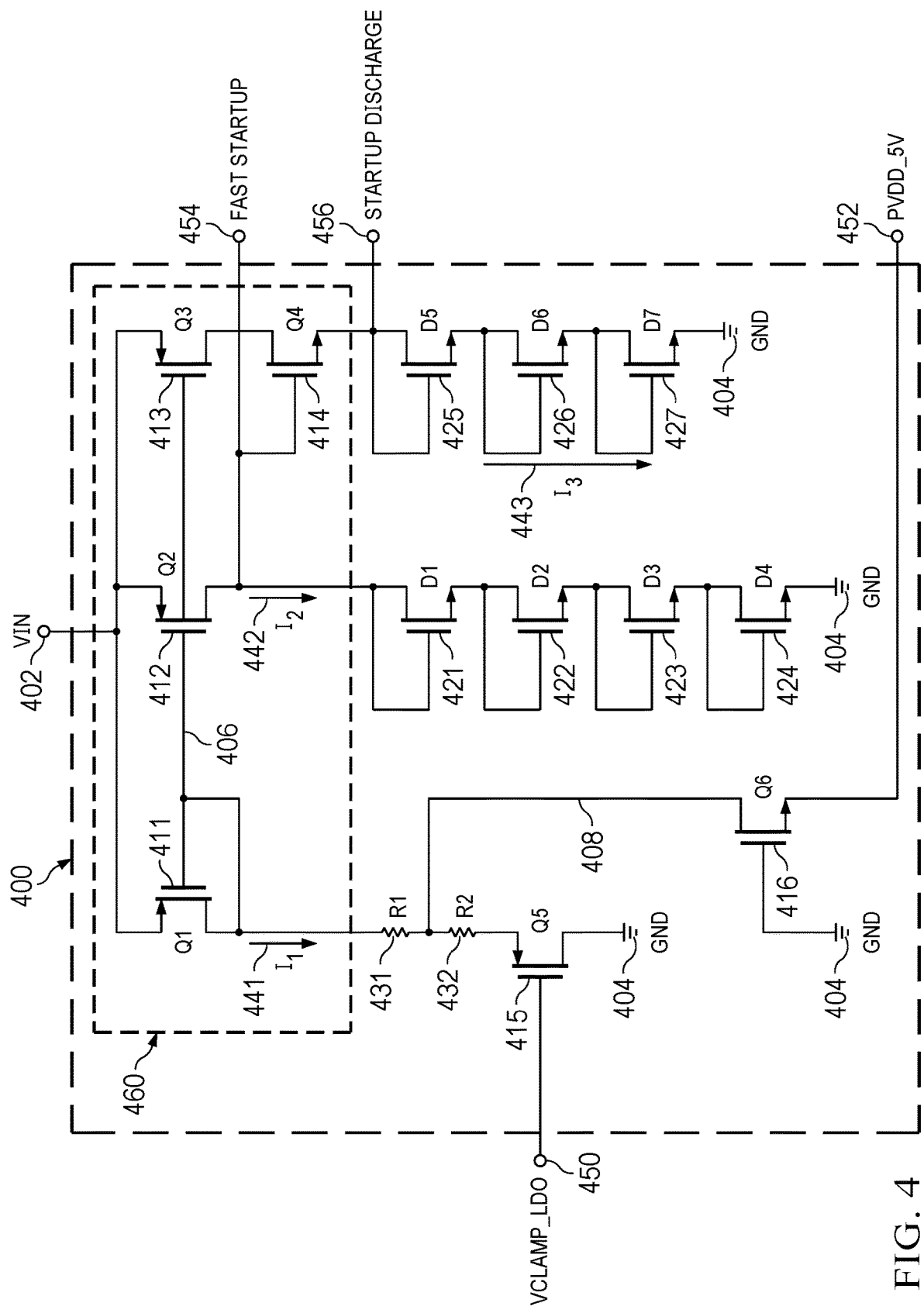
FIG. 4 illustrates an example embodiment of the startup module of FIG. 3.

FIG. 4 illustrates an example embodiment of the startup module 400 of FIG. 3. In this example embodiment, startup module 400 includes a current mirror, two diode stacks to clamp outputs to maximum voltages, and a turn-off FET 415 configured to turn-off the startup module 400 when it is no longer needed.

In this example embodiment, startup module 400 includes a first FET 411 having a first drain, a first gate, and a first source. The first source is coupled with the supply voltage VIN 402, and the first gate 406 is coupled to the first drain and to a ground 404 through a resistance element, resistors R1 431 and R2 432. The first FET 411 produces a current I1 441 which is mirrored by additional components within startup module 400.

Startup module 400 also includes a second FET 412 having a second source coupled with the supply voltage VIN 402, a second gate coupled 406 with the first gate and the first drain, and a second drain coupled to the ground 404 through a first diode (in this example the first diode is a series of four diodes D1 421, D2 422, D3 423, and D4 424). The second drain provides a fast startup signal 454. The second FET 412 is configured to mirror the current through the first FET 411 in a second current I2 442.

Startup module 400 further includes a third FET 413 having a third source coupled with the supply voltage VIN 402, a third gate coupled 406 with the first gate and first drain, and a third drain.

Startup module 400 also includes a fourth FET 414 having a fourth drain coupled with the third drain, a fourth gate coupled with the fast startup signal 454, and a fourth source coupled to the ground through a second diode (in this example the second diode is a series of three diodes D5 425, D6 426, and D7 427). The fourth source provides the startup discharge signal 456 to the gate of the discharge transistor. The third FET 413 and the fourth FET 414 are configured to mirror the current through the first FET 411 in a third current I3 443.

In some example embodiments, the first, second, and third FETs (411, 412, and 413) are p-channel metal-oxide-semiconductor (PMOS) transistors, and the fourth FET 414 is a natural n-channel metal-oxide-semiconductor (NMOS) transistor, used to clamp the voltage on the startup discharge signal 456, and is not required in some embodiments. In some example embodiments, the first and second diodes comprise n-channel metal-oxide-semiconductor (NMOS) transistor each having a gate and a drain coupled together in a diode configuration.

Startup module 400 further includes a fifth FET 415 configured in series between the ground 404 and the resistance element (resistors R1 431 and R2 432) having a fifth gate coupled to the slow control voltage VCLAMP_LDO 450. In some embodiments the fifth FET 415 is a p-channel metal-oxide-semiconductor (PMOS) transistor.

This example embodiment includes a sixth FET 416 having a drain coupled between resistors R1 431 and R2 432 and a source coupled to PVDD_5V 452. In some embodiments, the sixth FET 416 is a natural transistor to ensure current consumption even when its gate is tied to ground. It is used to create a current I1 411 even when VIN 402 is very low and if PVDD_5V 452 is around 0V.

When VIN 402 is applied current I1 411 is generated as long as PVDD_5V 452 is low or VCLAMP_LDO 450 is less than VIN−VGS(first FET)−VGS(fifth FET), where VGS (first FET) is the voltage difference between the gate and source of the first FET 411 and VGS(fifth FET) is the voltage difference between the gate and source of the fifth FET 415.

Current I2 442 generates the fast startup signal 454 with the first diode (D1 421, D2 422, D3 423, and D4 424) configured to limit the fast startup signal 454 to a first maximum voltage less than a maximum allowed supply voltage VIN 402. The fast startup signal 454 is used to generate PVDD_5V_p (illustrated in FIG. 5 and discussed below) in parallel to the main source-follower that uses VCLAMP_LDO 450.

Current I3 443 is used to generate the startup discharge signal 456 provided to a discharge transistor that discharges the gate of the high-side power FET to ground. In an example embodiment the fourth FET 414 is a natural (or native) transistor having a threshold voltage of approximately 20 mV with its gate coupled to the fast startup signal 454 and its source providing the startup discharge signal 456. The second diode (D5 425, D6 426, and D7 427) is configured to limit the startup discharge signal 456 to a second maximum voltage less than the maximum allowed supply voltage VIN 402.

Once VCLAMP_LDO 450 is high enough it disables the fifth FET 415. At the same time PVDD_5V 452 rises and deactivates natural transistor—sixth FET 416. This reduces I1 441 to zero and automatically turns off the current mirror within startup module 400 since it is no longer needed once all the power supplies have reached their nominal values.

Figure 5:
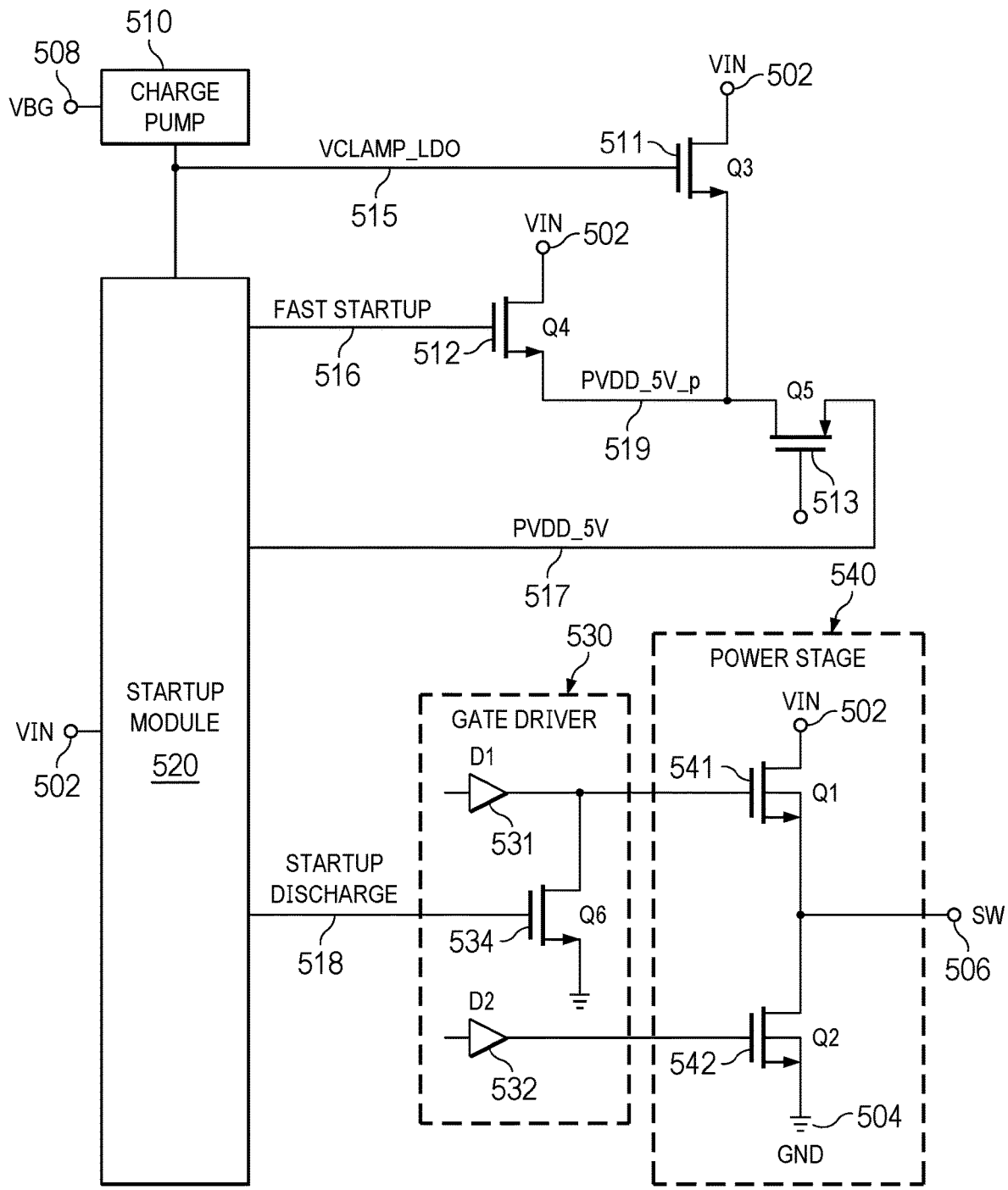
FIG. 5 illustrates an example embodiment of a power stage input node, along with a gate driver, startup module, and charge pump.

FIG. 5 illustrates an example embodiment of a power stage input node 540, along with a gate driver 530, startup module 520, and charge pump 510. In this example, high-side power FET 541 and low-side power FET 542 are coupled in series and make up the power stage input node 540. The drain of high-side power FET 541 is supplied with the supply voltage VIN 502 and the source of low-side power FET 542 is coupled to ground 504. Their output is SW 506 and has a current I(SW). The gate of the high-side FET 541 is driven by driver D1 531 within gate driver 530 and the gate of the low-side FET 542 is driven by driver D2 532 within gate driver 530. Gate driver 530 also includes a discharge transistor 534 coupled to the gate of the high-side FET 541 and configured to discharge the gate of the high-side power FET 541 when activated by the startup discharge signal 518.

The startup discharge signal 518 is provided by startup module 520. Startup module 520 receives the supply voltage VIN 502 and a slow control voltage VCLAMP_LDO 515 generated by charge pump 510. Startup module 520 is configured to supply a fast startup signal 516 and the startup discharge signal 518. In this example, the charge pump 510 uses a bandgap voltage VBG 508 as a reference to regulate the charge pump output voltage, however other embodiments may use different configuration. Charge pump 510 produces slow control voltage VCLAMP_LDO 515 which is configured to slowly rise to its nominal value some amount of time after the supply voltage VIN 502 reaches its nominal value.

The third FET 511 and the fourth FET 512 have drains coupled to the supply voltage VIN 502 and gates coupled to the slow control voltage VCLAMP_LDO 515 and the fast startup signal 516 respectively. Their sources are coupled together to provide PVDD_5V_p 519 to the drain of blanking switch 513. VCLAMP_LDO 515 is regulated to a fixed voltage to ensure that PVDD_5V_p 519 is clamped to a maximum voltage (e.g., 5V if VIN is 6V).

The startup module 520 is configured to generate the startup discharge signal 518 quickly such that it closely tracks the rise of the overall supply voltage VIN 502. This provides an advantage of discharging the parasitic gate to source capacitor within the high-side power FET 541 before the FET turns on and affects the output of the power stage.

The slow control voltage VCLAMP_LDO 515 is provided to the gate of a FET within the startup module 520 and turns off current mirrors within the startup module 520 that provide the startup discharge signal 518 once the slow control voltage VCLAMP_LDO 515 raises above the threshold voltage of the FET. This provides an advantage of turning off the startup module 520 once all supply rails within the system have stabilized at their nominal values and the discharge transistor 534 is turned off for normal operation of the power supply.

In this example embodiment, after the supply voltage VIN 502 is applied a pre-charge circuit brings up the slow control voltage VCLAMP_LDO 515. Once the band gap voltage is available, charge pump 510 increases the slow control voltage VCLAMP_LDO 515. Another fast supply rail is required to have sufficient voltage as fast as possible for the gate driver 530 to avoid the high-side FET 541 from turning on, resulting in high current I(SW) into SW 506. The startup discharge signal 518 is a very fast supply rail signal that is only used for some time after VIN 502 is applied to keep the gate of the high-side FET 541 tied to ground 504. After some time, the startup discharge signal 518 is actively pulled down to shut off the discharge transistor 534.

Figure 6:
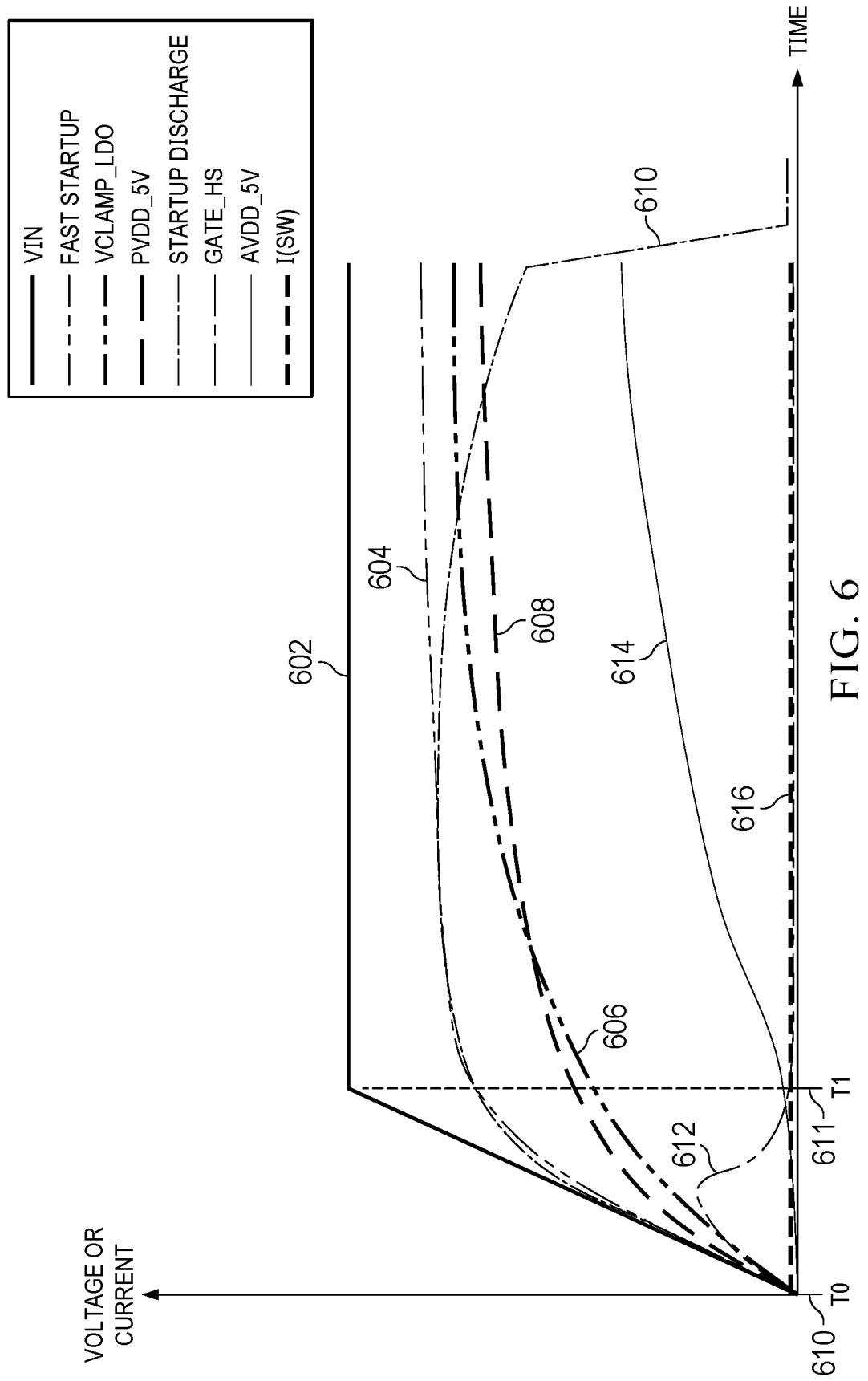
FIG. 6 illustrates example waveforms of the circuit of FIG. 5 during the power up process.

FIG. 6 illustrates example waveforms of the circuit of FIG. 5 during the power up process. In this example embodiment, various waveforms are illustrated on a graph where the vertical axis is increasing voltage or current, and the horizontal axis is time. Starting at time T0 610, all voltages and currents are zero.

During power up, the input supply voltage VIN 602 rises to its nominal value at time T1 211. Startup module 520 produces the fast startup signal 604 and the startup discharge signal 610 closely following the ramp of VIN 602, while the slow control signal VCLAMP_LDO 606 and PVDD_5V 608 have much lower ramp speeds. Internal supply signals such as AVDD_5V 614 rise even slower.

Since the startup discharge signal 610 rises so quickly, it is able to turn on the discharge transistor 534 quickly, discharging the charge on the gate of the high-side FET 541 as shown by the slight rise and quick discharge of the voltage on the gate of the high-side FET, GATE_HS 612. This results in the output current I(SW) 616 remaining essentially zero during power up of the power stage.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A circuit comprising:
   a current mirror including:
   a first field-effect transistor (FET) having a first drain, a first gate, and a first source, wherein:
   the first source is coupled with a supply voltage; and
   the first gate is coupled to the first drain and to a ground through a resistance element;
   a second FET having a second source coupled with the supply voltage, a second gate coupled with the first gate and the first drain, and a second drain configured to provide a fast startup signal;
   a third FET having a third source coupled with the supply voltage, a third gate coupled with the first gate and the first drain, and a third drain; and
   a fourth FET having a fourth drain coupled with the third drain, a fourth gate coupled with the fast startup signal, and a fourth source configured to provide a startup discharge signal to a gate of a discharge transistor;
   a first diode connected in series between the second drain and the ground, wherein the first diode is configured to limit the fast startup signal to a first maximum voltage less than a maximum allowed supply voltage; and
   a second diode connected in series between the fourth source and the ground, wherein the second diode is configured to limit the startup discharge signal to a second maximum voltage less than the maximum allowed supply voltage.

2. The circuit of claim 1, further comprising:
   A fifth FET configured in series between the ground and the resistance element having a fifth gate coupled with a slow control voltage, wherein during turn-on the slow control voltage rises slower than the supply voltage.

3. The circuit of claim 2, wherein the fifth FET is a p-channel metal-oxide-semiconductor (PMOS) transistor.

4. The circuit of claim 2, wherein the fifth FET is configured to turn off the current mirror when the slow control voltage rises above a threshold voltage.

5. The circuit of claim 2, wherein the slow control voltage is provided by a charge pump.

6. The circuit of claim 1, further comprising:
   a high-side power FET having a drain coupled with the supply voltage;
   wherein the discharge transistor has a drain coupled with a gate of the high-side power FET, a source coupled with the ground, and the gate of the discharge transistor is coupled with the startup discharge signal; and
   wherein the discharge transistor and is configured to discharge the gate of the high-side power FET when activated.

7. The circuit of claim 1, wherein the first, second, and third FETs are p-channel metal-oxide-semiconductor (PMOS) transistors, and the fourth FET is a natural n-channel metal-oxide-semiconductor (NMOS) transistor.

8. The circuit of claim 1, wherein the first and second diodes comprise n-channel metal-oxide-semiconductor (NMOS) transistors each having a gate and a drain coupled together in a diode configuration.

9. The circuit of claim 1, wherein the first diode includes four first diodes coupled in series and the second diode includes three second diodes coupled in series.

10. The circuit of claim 1, wherein the startup discharge signal is also provided to at least one logic gate configured to avoid turning on the discharge transistor during an electrostatic discharge (ESD) event.

11. A circuit, comprising:
   a first field-effect transistor (FET) having a first drain, a first gate, and a first source, wherein:
   the first source is coupled with a supply voltage; and
   the first gate is coupled to the first drain and to a ground through a resistance element;
   a second FET having a second source coupled with the supply voltage, a second gate coupled with the first gate and the first drain, and a second drain coupled to the ground through a first diode, wherein the second drain is configured to provide a fast startup signal;
   a third FET having a third source coupled with the supply voltage, a third gate coupled with the first gate and first drain, and a third drain; and
   a fourth FET having a fourth drain coupled with the third drain, a fourth gate coupled with the fast startup signal, and a fourth source coupled to the ground through a second diode, wherein the fourth source is configured to provide a startup discharge signal to a gate of a discharge transistor.

12. The circuit of claim 11, further comprising:
   A fifth FET configured in series between the ground and the resistance element having a fifth gate coupled with a slow control voltage, wherein during turn-on the slow control voltage rises slower than the supply voltage.

13. The circuit of claim 12, wherein the fifth FET is a p-channel metal-oxide-semiconductor (PMOS) transistor.

14. The circuit of claim 12, wherein the fifth FET is configured to turn off when the slow control voltage rises above a threshold voltage.

15. The circuit of claim 12, wherein the slow control voltage is provided by a charge pump.

16. The circuit of claim 11, further comprising:
a high-side power FET having a drain coupled with the supply voltage;
wherein the discharge transistor has a drain coupled with a gate of the high-side power FET, a source coupled with the ground, and the gate of the discharge transistor is coupled with the startup discharge signal; and
wherein the discharge transistor is configured to discharge the gate of the high-side power FET when activated.

17. The circuit of claim 11, wherein the first, second, and third FETs are p-channel metal-oxide-semiconductor (PMOS) transistors, and the fourth FET is a natural n-channel metal-oxide-semiconductor (NMOS) transistor.

18. The circuit of claim 11, wherein the first and second diodes comprise n-channel metal-oxide-semiconductor (NMOS) transistor each having a gate and a drain coupled together in a diode configuration.

19. The circuit of claim 11, further comprising:
four first diodes coupled in series, and configured to limit the fast startup signal to a first maximum voltage less than a maximum allowed supply voltage; and
three second diodes coupled in series, and configured to limit the startup discharge signal to a second maximum voltage less than the maximum allowed supply voltage.

20. A circuit comprising:
a power switch comprising a high-side power field-effect transistor (FET) having a drain coupled with a supply voltage;
a gate driver configured to provide a high-side gate signal to a gate of the high-side power FET, the gate driver comprising:
a discharge transistor having a drain coupled with the gate of the high-side power FET, a source coupled with a ground, and a gate coupled with a startup discharge signal, wherein in response to the startup discharge signal, the discharge transistor is configured to discharge the gate of the high-side power FET;
a power supply configured to provide a slow control voltage, wherein during turn-on the slow control voltage rises slower than the supply voltage; and
a startup module coupled with the power supply and the gate driver, the startup module comprising:
a first FET having a first drain, a first gate, and a first source, wherein:
the first source is coupled with the supply voltage; and
the first gate is coupled to the first drain and to a ground through a resistance element;
a second FET having a second source coupled with the supply voltage, a second gate coupled with the first gate and the first drain, and a second drain coupled to the ground through a first diode, wherein the second drain is configured to provide a fast startup signal;
a third FET having a third source coupled with the supply voltage, a third gate coupled with the first gate and first drain, and a third drain;
a fourth FET having a fourth drain coupled with the third drain, a fourth gate coupled with the fast startup signal, and a fourth source coupled to the ground through a second diode, wherein the fourth source is configured to provide the startup discharge signal to the gate of the discharge transistor; and
a fifth FET configured in series between the ground and the resistance element having a fifth gate coupled to the slow control voltage.

* * * * *